United States Patent
Suzuki

(10) Patent No.: US 8,446,522 B2
(45) Date of Patent: May 21, 2013

(54) PHOTOELECTRIC CONVERSION ELEMENT UNIT AND IMAGE PICKUP APPARATUS

(75) Inventor: Nobuyoshi Suzuki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 157 days.

(21) Appl. No.: 13/051,473

(22) Filed: Mar. 18, 2011

(65) Prior Publication Data

US 2011/0234866 A1    Sep. 29, 2011

(30) Foreign Application Priority Data

Mar. 26, 2010    (JP) .................................. 2010-071536

(51) Int. Cl.
*H04N 5/225*    (2006.01)

(52) U.S. Cl.
USPC ........................................................ 348/374

(58) Field of Classification Search
None
See application file for complete search history.

(56) References Cited

U.S. PATENT DOCUMENTS 5,783,815 A * 7/1998 Ikeda .......................... 250/208.1
7,772,542 B2   8/2010 Ishikawa
2002/0044215 A1 * 4/2002 Takagi et al. ................. 348/374

FOREIGN PATENT DOCUMENTS

CN    101459782 A    6/2009
JP    2009-141844    6/2009

OTHER PUBLICATIONS

Feb. 4, 2013 Chinese Office Action, which is enclosed with an English Translation, that issued in Chinese Patent Application No. 201110063675.7.

* cited by examiner

*Primary Examiner* — Albert Cutler
(74) *Attorney, Agent, or Firm* — Cowan, Liebowitz & Latman, P.C.

(57) ABSTRACT

A photoelectric conversion element unit includes a package includes a package including a photoelectric conversion element configured to perform a photoelectric conversion for an optical image of an object, a substrate mounted with an electronic component that includes a drive circuit configured to drive the photoelectric conversion element and a signal processing circuit configured to process a signal from the photoelectric conversion element, and a fixing plate having an opening, wherein the package and the electronic component are adjacent to each other in a direction orthogonal to an optical axis in the opening, and the package and the substrate are fixed onto the fixing plate.

5 Claims, 5 Drawing Sheets

PHOTOELECTRIC CONVERSION ELEMENT UNIT AND IMAGE PICKUP APPARATUS

BACKGROUND OF THE INVENTION

1. Field of the Invention

The present invention relates to a photoelectric conversion element unit and an image pickup apparatus.

2. Description of the Related Art

In order to shorten a wiring length from a photoelectric conversion element package to a drive circuit and a signal processing circuit in an image pickup apparatus, Japanese Laid-Open Patent Application No. ("JP") 2009-141844 discloses a photoelectric conversion element unit which has an opening of a fixing plate of a photoelectric conversion element package and arranges a drive circuit and a signal processing circuit in the opening.

However, JP 2009-141844 arranges the drive circuit and signal processing circuit on the backside of the photoelectric conversion element package, and a thickness of the photoelectric conversion element unit becomes thicker in the optical axis direction. When an electronic component, such as the drive circuit and the signal processing circuit, is thicker than the fixing plate, the thickness becomes larger than a conventional structure that arranges the photoelectric conversion element package on the fixing plate.

SUMMARY OF THE INVENTION

The present invention provides a photoelectric conversion element unit and an image pickup apparatus, which can provide a good electric characteristic and a small size.

A photoelectric conversion element unit according to the present invention includes a package including a photoelectric conversion element configured to perform a photoelectric conversion for an optical image of an object, a substrate mounted with an electronic component that includes a drive circuit configured to drive the photoelectric conversion element and a signal processing circuit configured to process a signal from the photoelectric conversion element, and a fixing plate having an opening, wherein the package and the electronic component are adjacent to each other in a direction orthogonal to an optical axis in the opening, and the package and the substrate are fixed onto the fixing plate.

Further features of the present invention will become apparent from the following description of exemplary embodiments with reference to the attached drawings.

DESCRIPTION OF THE EMBODIMENTS

Figure 1:
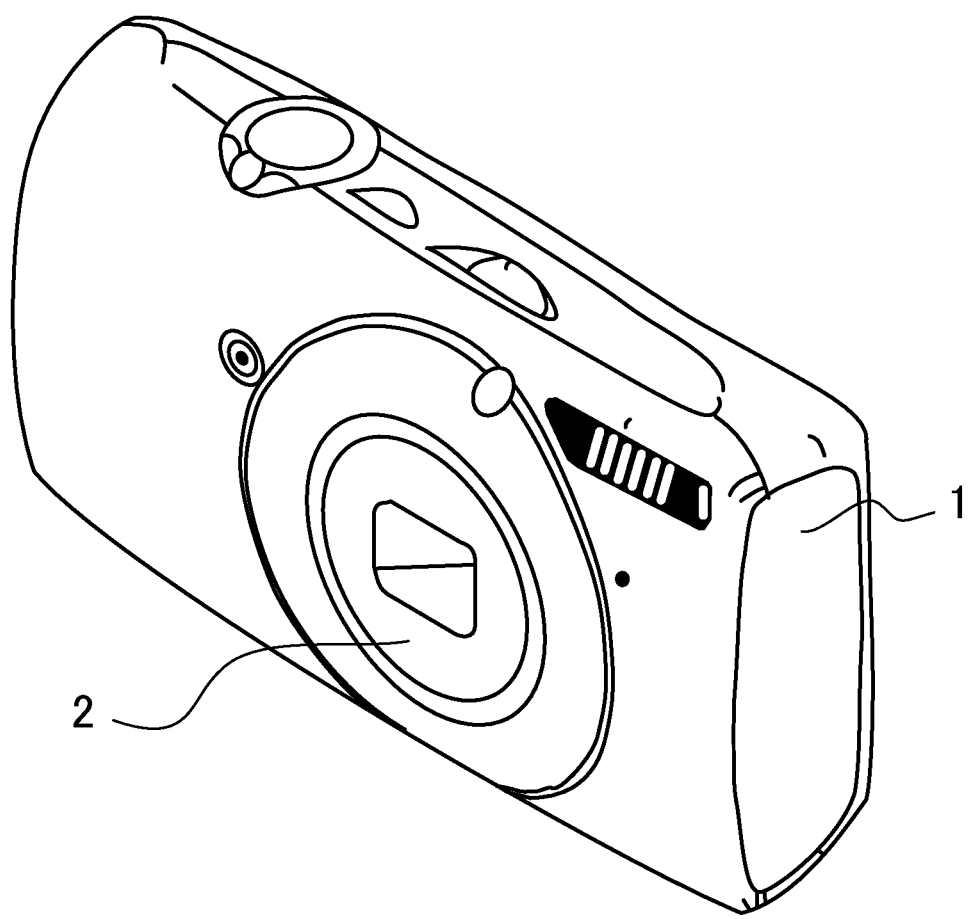
FIG. 1 is a perspective view of an image pickup apparatus of this embodiment.

FIG. 1 is a perspective view of an image pickup apparatus 1, and reference numeral 2 denotes an image pickup unit that houses an image pickup optical system (not illustrated) configured to form an optical image of an object. The image pickup apparatus 1 of this embodiment is a digital camera, but the present invention does not limit a type of the image pickup apparatus to a digital camera and may be applied to a video camera, etc.

Figure 2A:
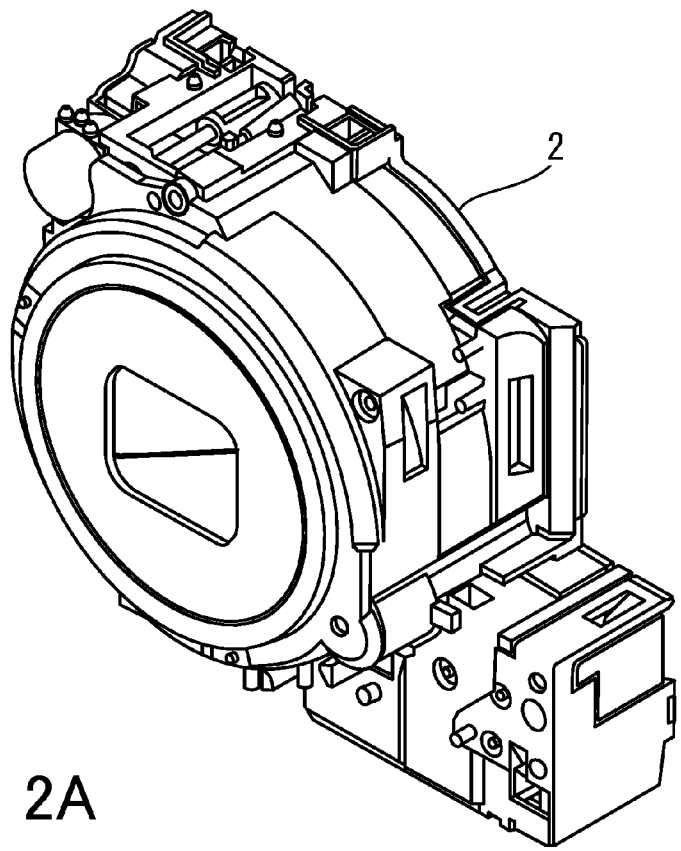
FIGS. 2A and 2B are perspective views of an image pickup unit illustrated in FIG. 1.
Figure 2B:
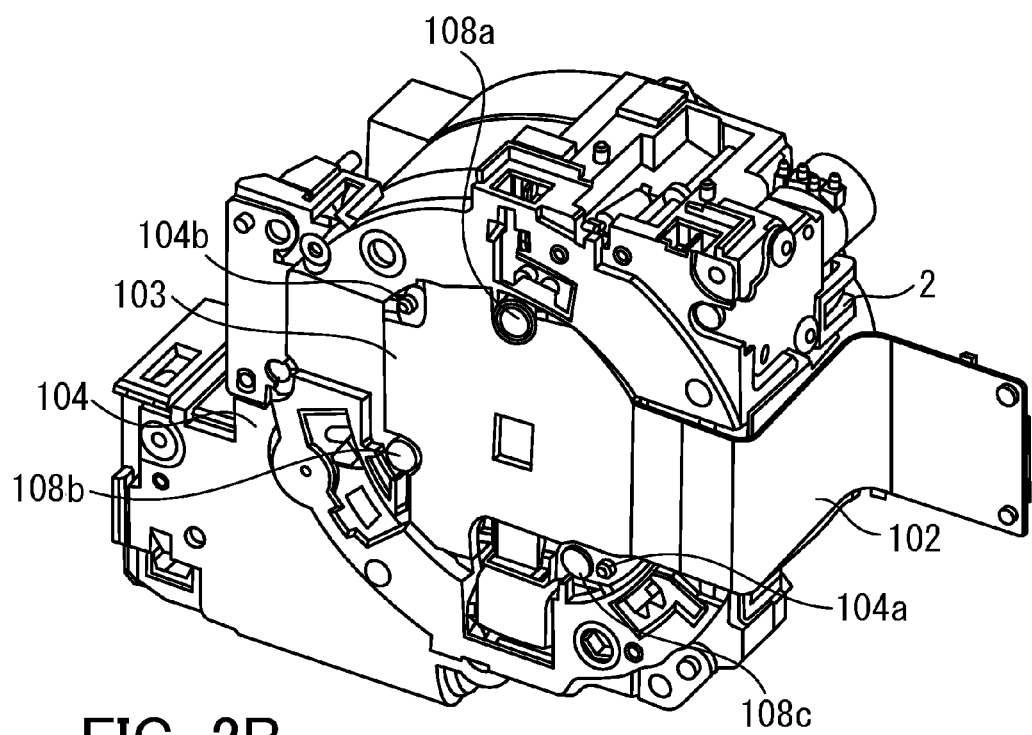
Figure 3:
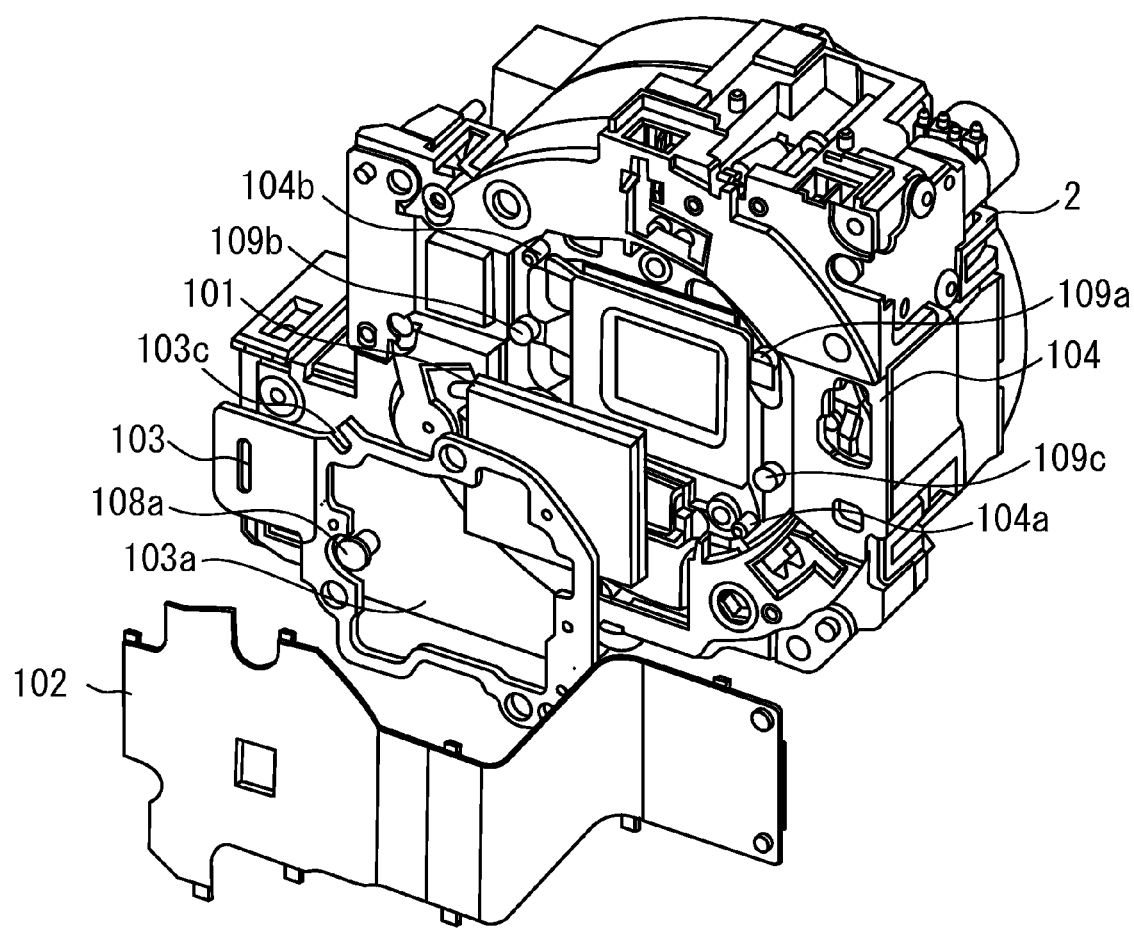
FIG. 3 is an exploded perspective view of image pickup unit illustrated in FIG. 2.

FIG. 2A is a perspective view of a front side of the image pickup unit 2, and FIG. 2B is a perspective view of a backside of the image pickup unit 2. FIG. 3 is an exploded perspective view of an image pickup unit 2 illustrated in FIG. 2B.

The image pickup unit 2 includes an image pickup device holder unit in which a barrel unit that houses an image pickup optical system (not illustrated) is attached to a front side of the image pickup device holder unit, and a photoelectric conversion element unit is attached to a backside of the image pickup device holder unit.

In FIG. 3, reference numeral 104 denotes an attachment portion of the photoelectric conversion element unit located on a rear surface (of the image pickup device holder unit) of the image pickup unit 2 in the digital camera 1.

Figure 4A:
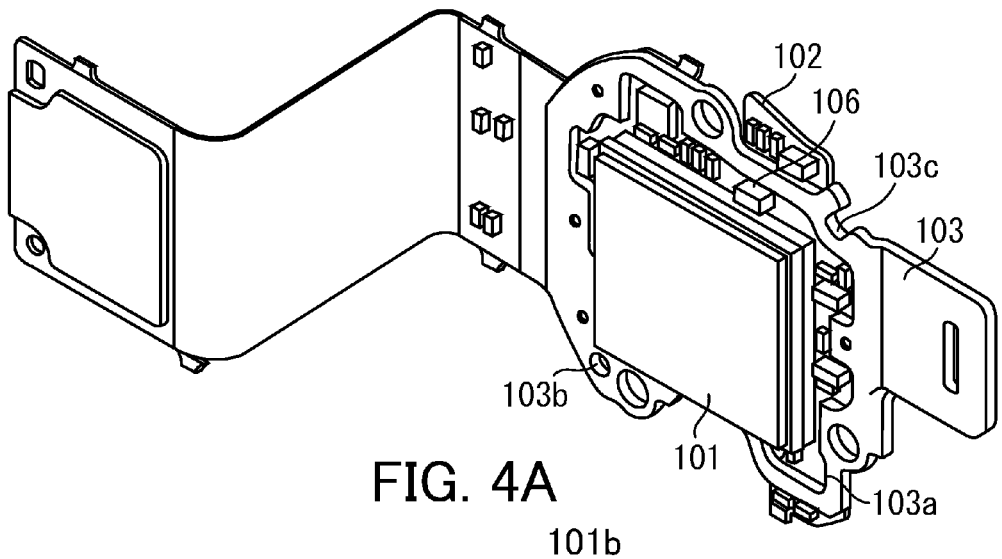
FIGS. 4A, 4B, and 4C are perspective, plane, and sectional views of a photoelectric conversion element unit illustrated in FIG. 1.
Figure 4B:
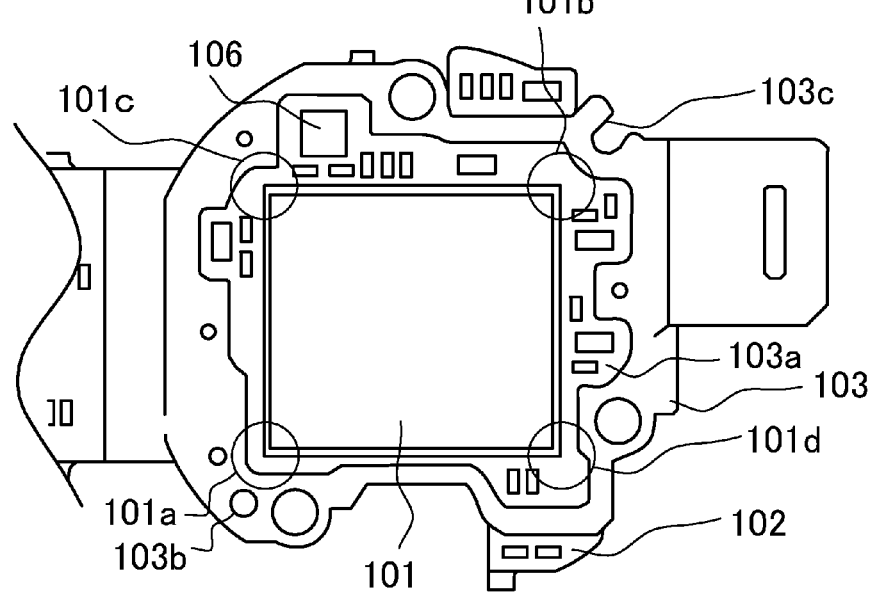
Figure 4C:
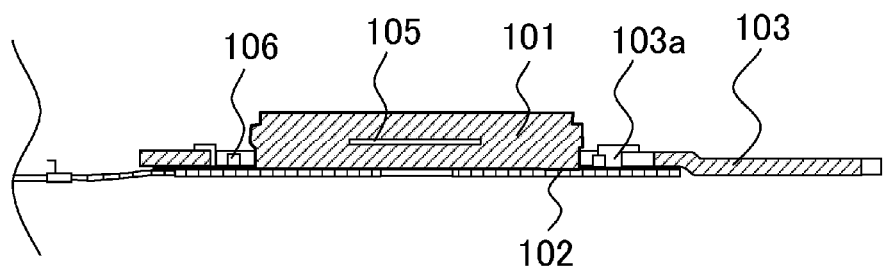

FIGS. 4A, 4B and 4C are perspective, plane, and sectional views of the photoelectric conversion unit. The photoelectric conversion element unit is a unit in which a fixing plate 103 mounted with a photoelectric conversion element package (simply referred to as "package" hereinafter) is mounted on a flexible substrate 102.

The package 101 houses a photoelectric conversion element 105 illustrated in FIG. 4C, such as a CCD sensor and a CMOS sensor, configured to perform a photoelectric conversion for an optical image of an object. The package 101 is fixed onto the fixing plate 103, and mounted on the flexible substrate 102.

An electronic component 106 connected electrically to the photoelectric conversion element 105 is mounted around the package 101 on the flexible substrate 102. The electronic component 106 includes a drive circuit configured to drive the photoelectric conversion element 105 and a signal processing circuit configured to process a signal from the photoelectric conversion element 105, and is implemented as an IC or its peripheral circuit component.

The fixing plate 103 has a rectangular frame shape and has an opening 103a at its center. The package 101 and the electronic component 106 mounted around the package 101 are arranged in the opening 103a. While the fixing plate 103 of this embodiment is made of metal, it may be made of resin.

As illustrated in FIGS. 4A and 4B, when the package 101 is arranged at the center of the opening 103a, the electronic component 106 is arranged between the package 101 and a contour of the fixing plate 103 that defines the opening 103a.

The electronic component 106 is arranged around the package 101, and adjacent to the package 101 in a direction orthogonal to an optical axis. Thus, the electronic component 106 is not laid on the package 101 in the direction parallel to the optical axis unlike JP 2009-141844. An adjacent arrangement between the electronic component 106 and the package 101 provides a good electronic characteristic, and the non-stacking configuration between the electronic component 106 and the package 101 in the direction parallel to the optical axis contributes to a miniaturization of the thickness of the photoelectric conversion unit in the optical axis direction (miniaturization).

While the outer circumference frame of the opening 103a closes in this embodiment, a U-shaped opening in which an outer circumferential frame is partially absent may be used.

In an attempt to fix (adhere) the package 101 onto the fixing plate 103, the package 101 is positioned relative to the fixing plate 103 using a jig (not illustrated) in the optical axis direction and the direction orthogonal to the optical axis direction of the package 101.

While the package 101 is being positioned, adhesive is flowed in a space between four corners 101a, 101b, 101c, and 101d and the opening 103a of the fixing plate 103 and cured so as to provisional fix the package 101 and the fixing plate 103. Thereby, the package 101 can be fixed in a well-balanced manner, and deformations after the provisional fixture can be restrained.

FIG. 4B illustrates this state. Since the electronic component 106 is arranged apart from the four corners 101a to 101d of the package 101, the package 101 and the fixing plate 103 can be provisionally fixed with a small amount of adhesive.

Next, the built-up structure is moved to a bonding jig (not illustrated), and an adhesive agent is flowed in a space between the side surface of the package 101 and the opening 103a of the fixing plate 103, and cured so as to fix the package 101 together with the flexible substrate 102 onto the fixing plate 103. Since the adhesive also bonds the electronic component 106, the adhesive area increases and the adhesive strength among the package 101, the flexible substrate 102, and the fixing plate 103 increases.

As illustrated in FIG. 4A, the package 101 and the electronic component 106 are arranged in the opening 103a of the fixing plate 103, and stacked on the fixing plate 103 in the thickness direction (optical axis direction). Hence, the thickness of the photoelectric conversion element unit can be made small.

The finished photoelectric conversion element unit is attached to the rear surface 104 of the image pickup unit 2 using screws 108a, 108b, and 108c, as illustrated in FIG. 2B. Positioning projections 104a and 104b are provided on the rear surface 104 of the image pickup unit 2, and positioning holes 103b and 103c are formed in the fixing plate 103. The photoelectric conversion element unit is positioned relative to the rear surface 104 of the image pickup unit 2 in the direction orthogonal to the optical axis direction by inserting the positioning projections 104a and 104b into the positioning holes 103b and 103c.

Three concaves are formed on the rear surface 104 of the image pickup unit 2, and provided with springs 109a, 109b, and 109c. The springs 109a to 109c force the fixing plate 103 in the optical axis direction against the screws 108a to 108c. The position in the optical axis direction and the inclination in the direction orthogonal to the optical axis direction of the photoelectric conversion element unit are fine-adjusted relative to the rear surface 104 of the image pickup unit 2 by adjusting a fastening amount of each of the screws 108a to 108c. This configuration provides highly precise positioning (optical adjustment) of the light-receiving surface of the photoelectric conversion element 105 relative to the imaging surface of the image pickup optical system.

The present invention precisely positions the package 101 relative to the fixing plate 103, and closely arranges the package 101 and the electronic component 106 to each other. Thus, a wiring length between the photoelectric conversion element 105 and the electronic component 106 can be shortened, and a good electric characteristic can be obtained. In addition, the electronic component 106 is adjacent to the package 101 in the direction orthogonal to the optical axis, does not overlap the package 101 in the optical axis direction, and is arranged in the opening 103a of the fixing plate 103 together with the package 101. Therefore, the photoelectric conversion element unit can be made thin in the optical axis direction.

If the electronic component 106 is mounted on a substrate different from the flexible substrate 102 (or provided outside of the photoelectric conversion element unit), a layout inside of the camera is restricted so as to shorten the wiring length from the package 101 to the electronic component 106. However, according to this embodiment, the electronic component 106 and the package 101 are mounted on the same flexible substrate 102 (or the electronic component 106 is provided in the photoelectric conversion element unit). As a consequence, no such restraints occur and the design freedom increases. Thereby, a variety of components and a substrate suitable for a miniaturization and a thin profile of the entire camera can be designed.

Figure 5:
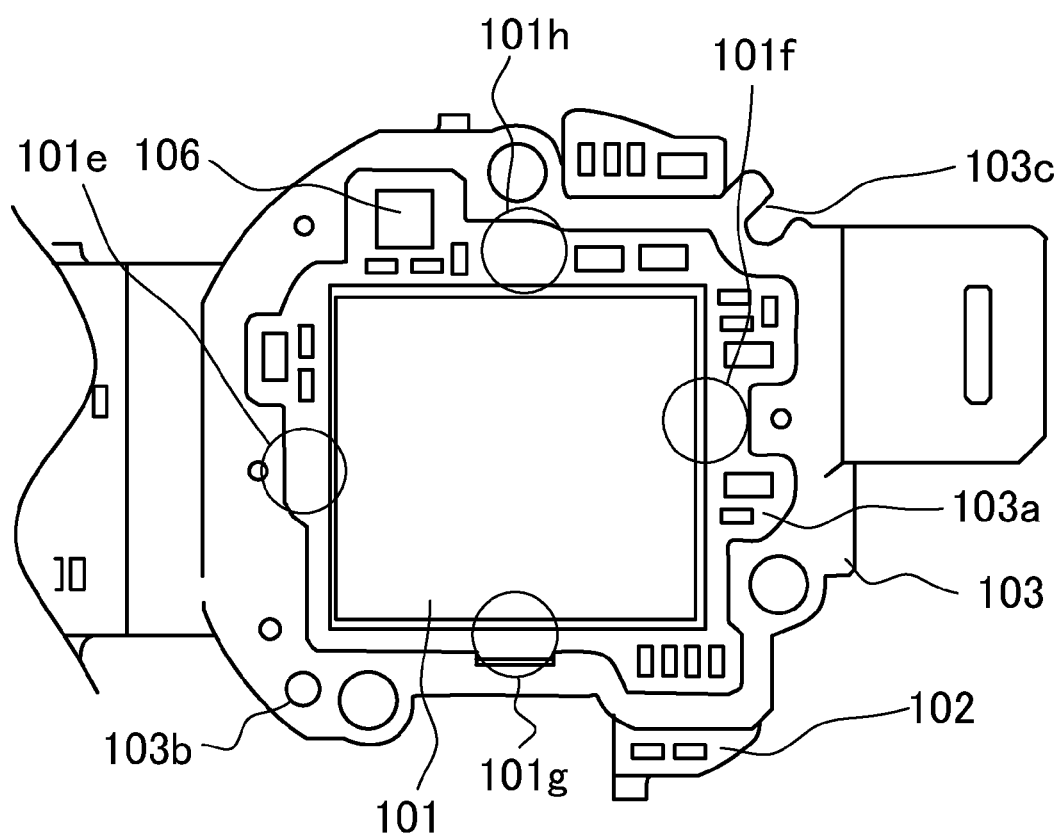
FIG. 5 is a plane view of a variation of the photoelectric conversion element unit.

FIG. 5 is a plane view of a variation of the photoelectric conversion element unit. The electronic component 106 is arranged apart from the four sides' centers 101e, 101f, 101g, and 101h of the package 101. Provisional fixing of the package 101 to the fixing plate 103 is performed through the four sides' centers 101e to 101h of the package 101. Thereby, the package 101 can be provisionally fixed onto the fixing plate 103 with a small amount of adhesive. When the fixing plate 103 is bonded at the four sides' centers of the package 101, the package 101 can be fixed in a well-balanced manner and the deformations after the provisional fixture can be restrained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-071536, filed Mar. 26, 2010, which is hereby incorporated by reference herein in its entirety.

What is claimed is:

1. A photoelectric conversion element unit comprising:
   a package including a photoelectric conversion element configured to perform a photoelectric conversion for an optical image of an object;
   a substrate mounted with an electronic component that includes a drive circuit configured to drive the photoelectric conversion element and a signal processing circuit configured to process a signal from the photoelectric conversion element; and
   a fixing plate having an opening,
   wherein the substrate is provided on the rear surface side of the fixing plate,
   wherein the package and the electronic component are provided on the object side of the substrate,
   wherein the height of the package in an optical axis direction is larger than the height of the fixing plate in the optical axis direction,
   wherein the package and the electronic component are overlapping with the fixing plate as seen from an orthogonal direction of the optical axis,
   wherein the opening is filled with an adhesive agent so that the package, the electronic component, and the substrate are fixed to the fixing plate.

2. The photoelectric conversion element unit according to claim 1, wherein the electronic component is arranged apart from each of four corners of the package.

3. The photoelectric conversion element unit according to claim 1, wherein the package is mounted on the substrate.

4. An image pickup apparatus comprising a photoelectric conversion element unit,
   wherein the photoelectric conversion element unit includes:

a package including a photoelectric conversion element configured to perform a photoelectric conversion for an optical image of an object;

a substrate mounted with an electronic component that includes a drive circuit configured to drive the photoelectric conversion element and a signal processing circuit configured to process a signal from the photoelectric conversion element; and a fixing plate having an opening, wherein the substrate is provided on the rear surface side of the fixing plate, wherein the package and the electronic component are provided on the object side of the substrate, wherein the height of the package in an optical axis direction is larger than the height of the fixing plate in the optical axis direction, wherein the package and the electronic component are overlapping with the fixing plate as seen from an orthogonal direction of the optical axis, wherein the package and the electronic component are arranged in the opening, and wherein the opening is filled with an adhesive agent so that the package, the electronic component, and the substrate are fixed to the fixing plate.

5. The image pickup apparatus according to claim 4, wherein the package is mounted on the substrate.

* * * * *